United States Patent
Chiu

(10) Patent No.: US 7,420,497 B2
(45) Date of Patent: Sep. 2, 2008

(54) LOW OFFSET FLASH ANALOG-TO-DIGITAL CONVERTER

(75) Inventor: Janice Chiu, Tustin, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/477,271

(22) Filed: Jun. 28, 2006

(65) Prior Publication Data

US 2008/0001807 A1  Jan. 3, 2008

(51) Int. Cl.
  *H03M 1/12* (2006.01)
(52) U.S. Cl. .................. 341/155; 341/200; 330/252
(58) Field of Classification Search ............. 341/200, 341/155, 143; 330/253, 254, 252; 327/108, 327/563
  See application file for complete search history.

(56) References Cited

U.S. PATENT DOCUMENTS

| | | | | |
|---|---|---|---|---|
| 5,157,397 A | * | 10/1992 | Vernon | 341/159 |
| 5,942,937 A | * | 8/1999 | Bell | 329/303 |
| 6,163,215 A | * | 12/2000 | Shibata et al. | 330/254 |
| 6,674,381 B1 | * | 1/2004 | Gomez et al. | 341/143 |
| 6,735,133 B1 | * | 5/2004 | Tsukikawa | 365/201 |
| 6,825,784 B1 | | 11/2004 | Zhang | |
| 6,977,543 B2 | * | 12/2005 | Heedley et al. | 327/563 |
| 7,030,695 B2 | * | 4/2006 | May et al. | 330/253 |
| 7,135,926 B2 | * | 11/2006 | Caresosa et al. | 330/254 |
| 2003/0042943 A1 | * | 3/2003 | Randazzo et al. | 327/108 |
| 2006/0109055 A1 | * | 5/2006 | Pennock | 330/253 |

\* cited by examiner

*Primary Examiner*—Peguy JeanPierre
(74) *Attorney, Agent, or Firm*—Brake Hughes Bellermann, LLP; Paul W. Churilla

(57) ABSTRACT

A quantizer is described for use in a flash analog to digital converter (ADC), which may be implemented as part of an integrated wireless transceiver or other highly integrated electrical circuit. The quantizer may be configured to operate within such a flash ADC in an accurate manner within a desired voltage range, while minimizing factors that may otherwise lead to errors in the analog-to-digital conversion process. For example, a comparator of the quantizer may be used that has properties that are particularly well-suited for such an environment, where such properties may include, for example, a relatively low input referred offset voltage that is associated with a preamplifier of the comparator.

18 Claims, 4 Drawing Sheets

LOW OFFSET FLASH ANALOG-TO-DIGITAL CONVERTER

TECHNICAL FIELD

This description relates to analog-to-digital converters and/or associated circuitry.

BACKGROUND

Wireless devices, including transmitters and receivers, are used in many applications. For example, such applications may include computer communications systems and wireless cell phones. To reduce the cost and complexity of designing and manufacturing such wireless communication devices, and to reduce a size of such devices, much of the related circuitry may be integrated onto a small number of integrated circuit chips.

Such wireless devices, and other devices, may perform digital signal processing as part of their operation. Consequently, for example, analog signals that are characteristic of wireless signals may be converted into digital form. In so doing, an analog-to-digital (ADC) converter is typically used. Many types of ADC converters exist, and have various characteristics, advantages, and disadvantages.

For example, some types of ADC converters offer high-speed analog-to-digital conversion, and require a relatively high voltage to operate. Other types of ADC converters may offer a high level of precision, but may operate at relatively low speeds. In general, then, it may be difficult to find a type of ADC converter that meets all (or, at least, a sufficient number of) requirements of a particular setting. For example, in the setting of the wireless devices just described, it may be necessary or desirable to perform the analog-to-digital conversion at relatively high speeds and with a high level of precision, but at relatively low power and low voltage levels.

SUMMARY

According to one general aspect, a quantizer includes a resistive divider chain reference, and a set of stacked comparators. Each comparator includes a pre-amplifier stage in which a preamplifier includes an input stage in which a thin oxide metal-oxide-semiconductor (MOS) transistor is connected in a cascode configuration to a thick oxide MOS transistor, and a latch stage following the pre-amplifier stage.

According to another general aspect, a quantizer for use in a flash ADC integrated on a CMOS integrated circuit wireless transceiver is described, which includes a chain of resistive elements as reference to a set of matched comparators. Each comparator includes a differential input stage including a pair of complementary transistors, including an input transistor being of a native thin oxide type, and a cascoded transistor being a thick oxide type, and a latch stage connected to the output of the preamplifier.

According to another general aspect, a preamplifier for use in a comparator is described. The preamplifier includes an input stage including a first transistor connected in cascode fashion to a second transistor, a resistive load connected to the first transistor, a reference input stage including a third transistor connected in cascode fashion to a fourth transistor, and a current source, wherein the first and third transistor are both connected to each other and to the current source.

The details of one or more implementations are set forth in the accompanying drawings and the description below. Other features will be apparent from the description and drawings, and from the claims.

DETAILED DESCRIPTION

Figure 1:
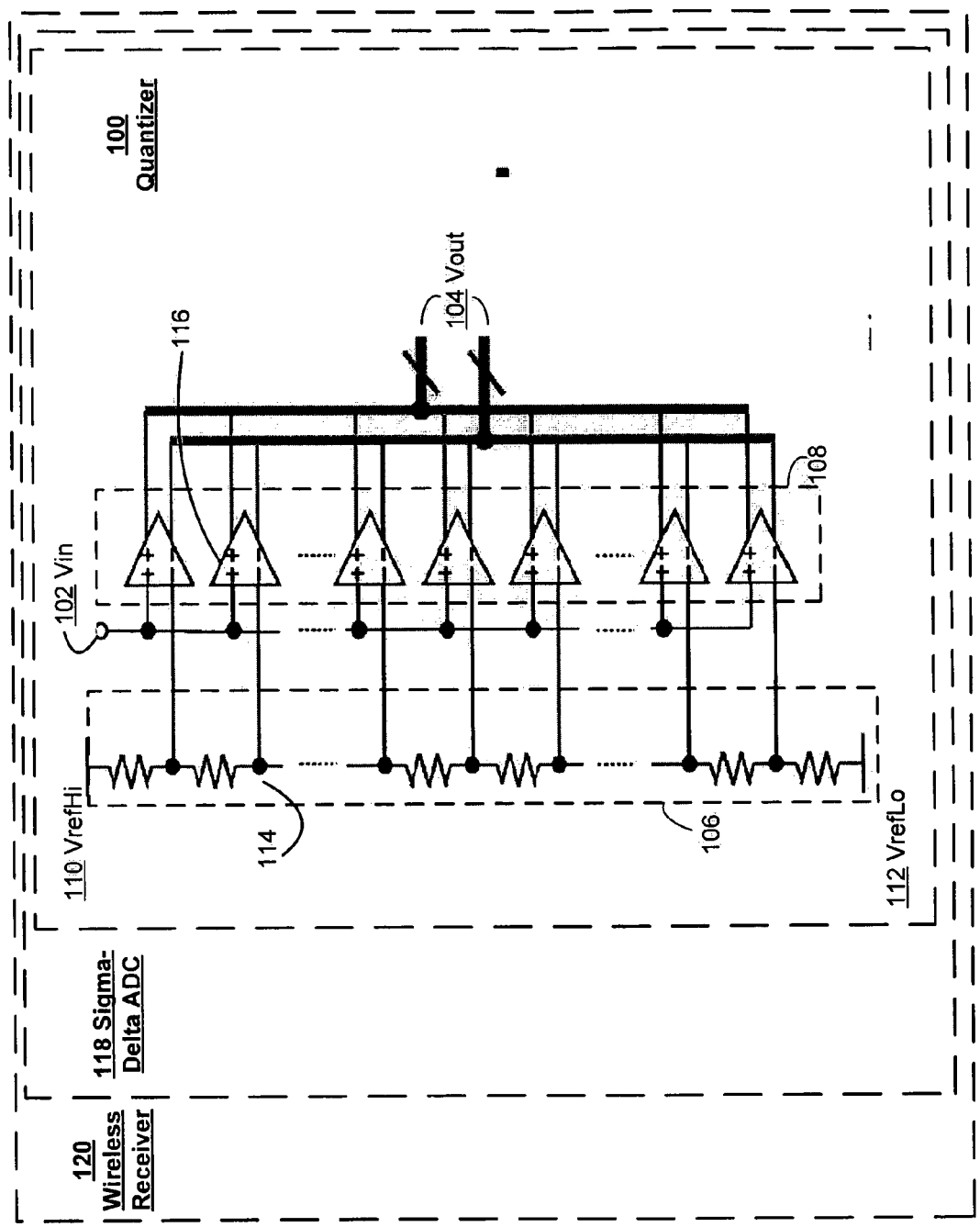
FIG. 1 is a block diagram of a quantizer for use in a flash analog to digital converter (ADC).

FIG. 1 is a block diagram of a quantizer 100 for use in a flash analog to digital converter (ADC). In general, and as referenced above, such a flash ADC converter may be implemented, for example, as part of an integrated wireless transceiver or other highly integrated electrical circuit. The quantizer of FIG. 1 is configured to operate within such a flash ADC in an accurate manner within a desired voltage range, while minimizing factors that may otherwise lead to errors in the analog-to-digital conversion process. For example, in the quantizer of FIG. 1, a comparator 116 may be used that has properties that are particularly well-suited for such an environment, where such properties may include, for example, a relatively low input-referred offset voltage that is associated with a preamplifier of the comparator 116, as described in more detail, below.

In the quantizer 100 of FIG. 1, certain circuit elements that may be related to an overall operation of the flash ADC are not shown, for the sake of clarity. For example, analog circuitry that may precede the quantizer 100 is not shown, where such analog circuitry may be responsible for, for example, providing an analog signal that is within the range of the quantizer 100. As another example, logic may be included at an output of the quantizer 100, e.g., to encode an output of the quantizer 100 in binary form. Thus, it should be understood that an overall operation of a flash ADC is known, so that details beyond those necessary to describe the quantizer 100 are not provided here. Moreover, inasmuch as the quantizer 100 provides many of the essential functions of a flash ADC, the quantizer 100 also may be referred to as a flash ADC in some contexts.

Thus, the quantizer 100 is configured receive an analog signal at an input Vin 102, for conversion to a digital value at an output Vout 104. The quantizer 100 includes a chain of matched resistors 106 and a set of matched comparators 108. In general, during operation, a set voltage is dropped across the chain of matched resistors 106, while the input voltage Vin 102 varies. Based on this variation, a varying number of the comparators 108 are turned on or off, and the output digital signal Vout 104 is determined based on the number of comparators 108 turned on/off over a given time period.

More specifically, the chain of resistors 106 is connected to the two terminals of voltage references VrefHi 110 and VrefLo 112. For example, VrefHi 110 may be set by an external, stable, reference source, and VrefLo 112 may be connected to ground. Since the resistors 106 are matched, voltages at the nodes between the resistors 106 form a uniform set of steps in voltages between VrefHi 110 and VrefLo 112. Generally there is one more resistor in the chain of resistors 106 than there are comparators 108. For example, if there are 16 comparators, then there are 17 resistors in the chain, in order to form the configuration shown and described herein.

The nodes between the resistors 106 in the resistive divider chain are connected to the reference input of the comparators 108. The input analog signal, Vin 102, is connected to the input(s) of all of the comparators 108. Thus, for example, the voltage at node 114 is connected to the reference input of the comparator 116.

When the input voltage Vin 102 is greater than the voltage at the node 114, the output of the comparator 116 will be a digital 1; otherwise the voltage at the output of the comparator 116 will be a digital 0. As the input voltage Vin 102 increases, an increasing number of the comparators 108 are turned on, e.g., an increasing number of the comparators 108 have an output that represents a digital 1.

When the voltage steps in the resistor chain 106 are linear, the output of the comparators 108, will have a linearly increasing number of comparators 108 with outputs of digital 1. For example, if there are 16 comparators, the input analog signal Vin 102 is converted to one of 16 different digital levels at the output Vout 104. Logic (not shown) at the output of the quantizer 100 may then be used to convert the number of comparators whose outputs are 1 to a binary encoded value. For the example chosen, where there are 16 comparators, the output of such logic would be a 4 bit digital value.

The described implementation of the quantizer 100 provides one example, in which the response of the quantizer 100 is linear. In other implementations, however, the overall response of the quantizer 100 may be made non-linear, e.g., by suitably choosing different resistor values, if such a response is needed.

In FIG. 1, then, it may be appreciated that the analog-to-digital conversion operations of the quantizer 100 are related, for example, to an accuracy with which a desired voltage appears at the nodes of the chain of resistors 106 (e.g., at the node 114). For example, if a voltage at the node 114 is higher or lower than expected, then a comparison performed by the comparator 116 may result in an output of a digital 1 instead of a digital 0, or vice-versa.

One technique for reducing the possibility of such effects is to increase VrefHi 110, relative to VrefLo 112. For example, as VrefHi 110 is increased, then a voltage difference across each of the resistors 106 (i.e., between each consecutive pair of the nodes between the resistors 106) is also increased. This can be advantageous, in the sense that the higher voltage across each of the resistors 106 implies that the quantizer 100, as a whole, is less sensitive to minor voltage variations.

On the other hand, one of the primary drivers of integrated circuit technology is the ability to make smaller features on the silicon wafer from which the integrated circuit is constructed. As the features, e.g., the transistors, become smaller, they are generally operated at smaller and smaller voltages to avoid breakdown effects. Current integrated circuits often run at voltages of less than about 3.0 volts, so that the range of voltages available to run the chain of 106 in FIG. 1 is also limited.

For example, if the quantizer 100 is incorporated into a flash ADC that is incorporated into a wireless transceiver, an entire reference voltage difference between the VrefHi 110 and VrefLo 112 may be on the order of about 600 mv-1V, e.g., 750 mV or 900 mV. With such a small voltage range, the voltage difference between any two points on the resistive divider chain is even smaller. For example, with a 900 mV reference voltage, the voltage difference across any one of the equal resistors 106 in the 16 comparator quantizer 100 is only 52.94mV.

Consequently, sources of voltage variation within the quantizer 100 should be minimized. One source of voltage variation includes a voltage offset that may be experienced by each of the comparators 108, e.g., the comparator 116.

Figure 2:
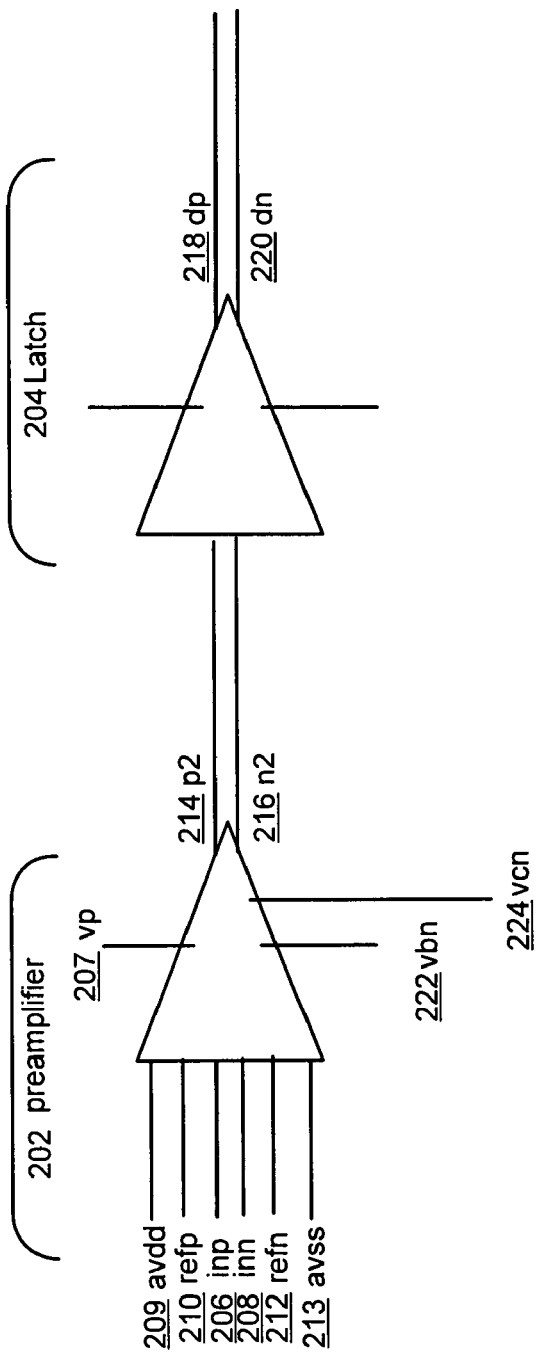
FIG. 2 is a block diagram of the elements of a comparator of FIG. 1.

FIG. 2 shows a block diagram of one of the comparators 108 in FIG. 1, e.g., the comparator 116. In the example of FIG. 2, the comparator 116 includes two primary elements: a preamplifier 202 that is configured to amplify an input signal to the comparator 116, and a latch unit 204. In the following description, it should be understood that various known or conventional details of how the comparator 116 may be operated may be omitted for the sake of clarity and brevity.

The preamplifier 202 has a differential input including a positive input inp 206 and a negative input inn 208, so that a positive/negative output 214/216 of the preamplifier 202 is proportional to the difference(s) between a positive/negative reference input(s) 210, 212 and the input signal(s) 206, 208. The preamplifier 202 is configured to ensure that even a small difference between the signal input 206, 208 and the reference input 210, 212 will be detected and included within the output 214/216. Application and use(s) of voltages vp 207, avdd 209, avss 213, vbn 222, and vcn 224 will be apparent, and are described in more detail below, with respect to FIG. 3.

The latch 204 provides a thresholding function, whereby all preamplifier outputs 214, 216 above a predetermined level produce a digital "1" at the output of the latch 204. Since the preamplifier 202 has high gain, this combination of high gain and thresholding ensures that the input signal 206, 208 to the preamplifier 202 need be only a very small amount above the reference 210, 212 to make the output of the comparator 116 a digital "1." The latch 204 is clocked, that is, it performs its latching function only when commanded by an external clock (described in more detail below, with respect to FIG. 4). This ensures that the output of the quantizer 100 is a data stream sampled at the clock frequency.

As discussed above with respect to FIG. 1, a small voltage difference(s) between nodes of the chain of resistors 106 may result in reduced accuracy and reliability of the quantizer 100. One possible source of such voltage differences may include a voltage offset associated with the preamplifier 202. For example, such a voltage offset may be seen as the voltage required to be applied to the differential input 206, 208 to drive the differential input 206, 208 to zero.

Such voltage offsets may occur, for example, due to imperfections in the fabrication process used to create the preamplifier 202 or components thereof, as described in more detail below. Such voltage offsets also may be related to a size of the transistors (or other components) that make up the preamplifier 202. For example, such transistors or other components may be desired to be completely symmetrical or matched, yet mismatches may occur between such ideally symmetrical components. Although such imperfections or other sources of error may occur in a number of places within the preamplifier 202, the above-referenced characteristics of the voltage offsets allow the voltage offset to be considered to occur at an input to the preamplifier 202, so that such voltage offsets may be referred to as an input-referred offset voltage.

Since such offsets may introduce significant errors into the digitization process of the quantizer 100, the preamplifier 202 is designed to minimize input-referred offset voltage, as described in more detail below with respect to FIG. 3. Generally, such voltage offset(s) may be determined from, or related to, known parameters (and relationships therebetween), such as Avt, W, and L, where Avt is a known datasheet parameter that is sometimes referred to as a Pelgrom process-dependent parameter (e.g., a fitting constant), and W, L refer to area parameters (e.g., width, length) of an associated device (e.g., transistor). Avt for a given device(s), may usually be influenced by certain related parameters, such as, for example a thickness of a gate oxide of a given transistor.

Although the above description has been provided by way of example, it should be understood that various features, advantages, and uses of the quantizer 100 and associated comparator 116 may be achieved. For example, the quantizer 100 or flash ADC may be used as part of a larger circuit, such as, for example, a Sigma-Delta ADC circuit 118. Additionally, or alternatively, the quantizer 100 and/or the Sigma-Delta ADC may be used in a wireless receiver 120, which may itself be included in a cell phone, smart phone, or other device implementing, for example, a Global System for Mobile Communication (GSM) and/or an Enhanced General Packet Radio system (EDGE) receiver.

With the features described herein, the preamplifier 202 allows the comparator 116 (and other comparators within the bank of comparators 108) to exhibit properties that allow the quantizer 100 to meet very particular operational requirements, such as might occur in the context of the Sigma-Delta ADC, just referenced. For example, the comparator 116 is capable of taking a differential swing at its input of, for example, 1V peak-to-peak. The comparator 116 may be configured to meet the specification of having an input-referred offset voltage of less than about 15mV, and, in particular, may have an input-referred offset voltage of approximately 10mV, 3-sigma (e.g., exhibits an average of 10mV of offset to within three standard deviations). Further, the bandwidth of the comparator 116 should be, in some implementations (such as, potentially, the Sigma Delta ADC application just mentioned), at least twice a frequency of an associated sampling clock during a track mode of the preamplifier 202 (where such a track mode is discussed in more detail below, and a clock frequency may be, for example, 26MHz), so as not to distort a signal-to-noise (SNR) ratio of the comparator 116. In the circuits and examples described herein, a bandwidth of the comparator 116 may reach 100MHz or more. Consequently, a SNR of the Sigma-Delta ADC may reach, for example, 84dB or more.

Figure 3:
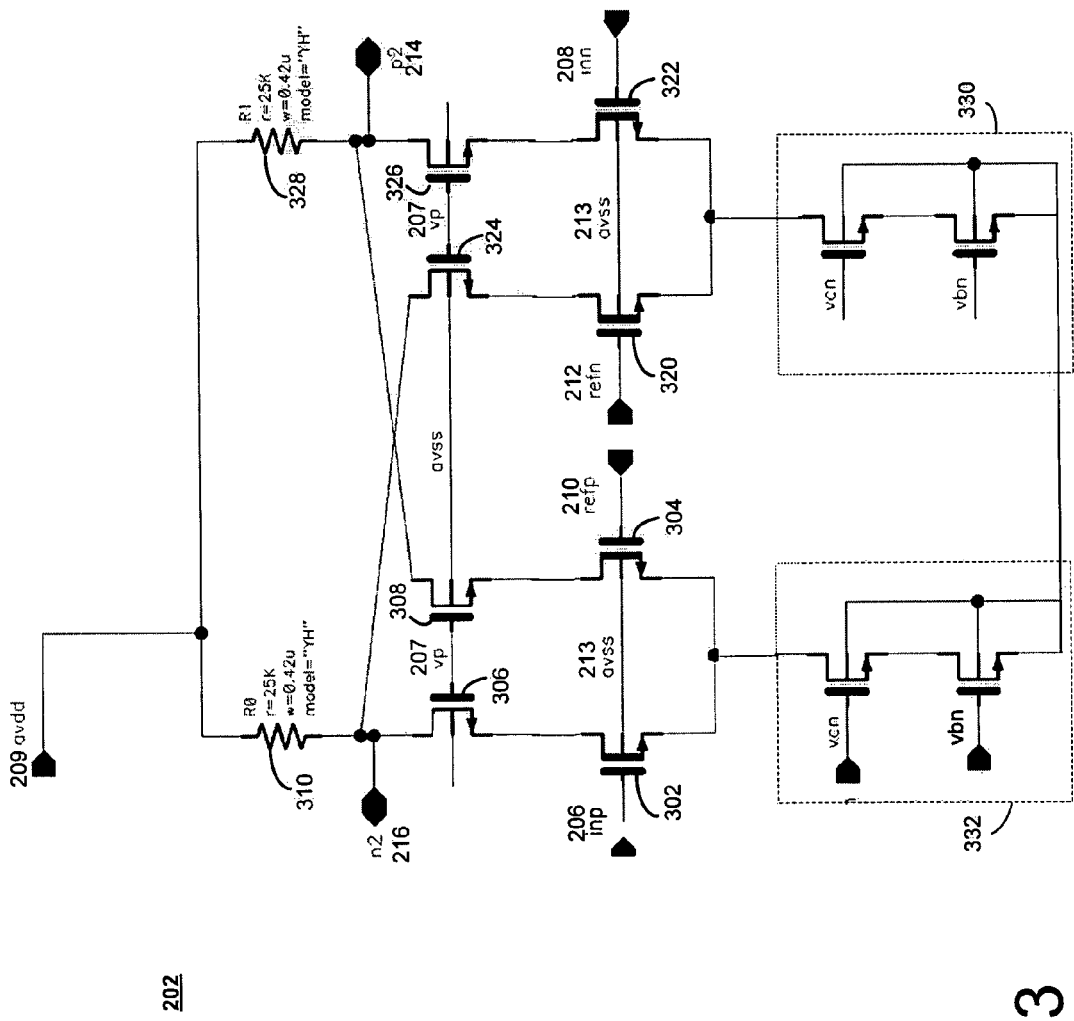
FIG. 3 is a schematic diagram of a preamplifier stage of a comparator of FIG. 1 and/or FIG. 2.

FIG. 3 is a schematic of a preamplifier circuit, such as the preamplifier 202, which may be implemented in complementary metal oxide semiconductor (CMOS) technology and designed, as just described, to minimize an associated input-referred offset voltage.

The preamplifier 202 shown has, as described above, the differential inputs 206, 208, so that the outputs p2 214 and n2 216 are proportional to the difference between the positive and negative inputs 206, 208. Transistors 302 and 306 may be connected, as shown, in a cascode fashion, such that the transistor 306 is biased through a bias voltage vp, which is generated by resistive divider circuitry not shown explicitly in FIG. 3. Thus, the transistors 302 and 306 form one leg of the differential preamplifier 202. Similarly, transistors 304 and 308 are also connected in cascode fashion, and form the other leg of the differential pair. Both legs are biased by a current source 332. The positive differential input analog signal inp 206 is connected to the gate of the transistor 302, while the negative reference signal 208 is connected to the gate of transistor 322. The two transistors that make up the current source 332 are also connected in a cascode configuration. Transistors 302, 304, 306, and 308, together with current source 332, may be considered to form the input stage for the positive signal component inp 206 of the differential input signal.

Similarly, for the negative input signal inn 208, the transistors 322 and 326 are connected in cascode configuration, forming one leg of the differential pair with transistors 320 and 324 forming the other leg. They are biased by current source 330.

As also shown, both the positive and negative amplifier halves utilize a passive (resistive) load. In particular, a resistor 310 is illustrated as loading the positive input half of the preamplifier 202, while a resistor 328 is illustrated as loading the negative input half of the preamplifier 202.

The two halves of the preamplifier 202 are cross-coupled, in that the leg of each half that has the reference signal 210, 212 as and its input is connected to the load resistor of the opposite side. Thus, for example, the transistor 324 and the transistor 306 are connected to the same load resistor 130. Meanwhile, the transistors 308 and 326 also share the common load resistor 328.

In operation, then, the preamplifier 202 behaves as follows. When both the input signal 206, 208 and reference inputs 210, 212 are equal, the current metered by the current sources 332 and 330 divide between the two legs of each differential pair, so that the output voltages 214 and 216 are equal. If the input signal 206 at the gate of transistor 302 is larger than the reference signal 210 at the gate of transistor 304, then the current metered by current source 332 is shifted so that more current flows through the load resistor 310 and transistors 302 and 306. This causes the voltage at the negative output 216, at the node of resistor 310 and transistor 306, to go lower. At the same time, the reduced current flow through transistors 304 and 308 cause the voltage at the positive output 214 to increase.

In similar fashion, an imbalance on the negative side of the preamplifier 202 will cause both the positive and negative outputs to swing in response to any difference between the inputs and the corresponding reference voltages.

Several features of the preamplifier 202 are included to obtain a minimum input-referred offset voltage. For example, the cascode configurations increase the output impedance and provide extra isolation between the input signals 206, 208 and the load resistors 310, 328.

Furthermore, the two transistors in the cascode configuration(s) may be of different manufacturing types. For example, by making the input transistors 302, 304, 320 and 322 using a thin gate oxide, the transconductance (gm) or gain of the input stage is made larger. In addition, such thin oxide devices have a lower Avt, which means they have an inherently lower offset voltage to begin with (since, for example, offset voltage may be related to $Avt/(W*L)^{-.5}$). Thin oxide devices (at the input) may be susceptible, however, e.g., to gate-source or gate-drain voltage breakdown, particularly at relatively high power supplies (e.g., around 3V), and particularly during start-up or power-down modes.

In contrast to the thin gate oxide transistors 302, 304, 320, 322, the cascode transistors 306, 308, 324, and 326 may be made as thick gate oxide devices. These transistors are thus better able to withstand higher voltages without gate breakdown. Consequently, the cascode combination has better gate breakdown voltage than if thin oxide transistors alone were used.

It should be understood that "thin" versus "thick" gate oxide devices may generally be defined relative to one another, and an absolute thickness of either type of device may vary, for example, based on a manufacturing process or other setting of the preamplifier 202 and/or quantizer 100. For example, a thickness of a gate oxide device may vary depending on whether the underlying microchip is manufactured using 90 nm or 130 nm CMOS design (e.g., oxides in the 130 nm setting may range from about 1-6 nm). In some example implementations, a thick gate oxide may include a gate oxide that is approximately twice a thickness of a thin gate oxide device.

A further technique for reducing the voltage controlled offset may include the manufacture and use of the input transistors 302, 322 as native devices. For example, normally, NMOS transistors are formed in a well of heavily doped p-type material embedded in a substrate. Native devices, however, are formed directly in the substrate. Native devices have several advantages in this regard. First, they have a lower threshold voltage, so they generally have higher gain. Furthermore, native devices usually are larger than their non-native counterparts, e.g., with respect to channel length. Since one of the sources of offset is differences in the size of the two input transistors, by making them larger the effect of any variations in transistor size due to manufacturing tolerance variations are reduced. Further, even to the extent that the Avt characteristics of the thick-oxide native devices/transistors and the thin-oxide transistors are similar, it should be understood that the thick oxide native devices are generally less likely to experience breakdown when using high power supplies.

The increased gain of the cascode combination reduces the effect of any variation at the output 214, 216 of the preamplifier 202. This is because any such offset must be divided by the gain to get the input-referred equivalent offset voltage. Since the gain is higher by using the combination of thick oxide native transistors and a cascode configuration, any offset at the output is reduced relative to, for example, a single transistor input stage. The cascode configuration also provides for improved isolation of any noise at the output being fed back to the input.

The use of a passive, resistive device(s) 310, 328 as the load for each half of the preamplifier 202 also contributes to reducing any offset. Because the resistors 310, 328 can be better controlled during the manufacturing process, e.g., with respect to the manufacturing of transistors, there is less chance of a variation. In addition, the use of a resistive load reduces the load or parasitic capacitance compared to that found using an active device. This improves the frequency response of the preamplifier 202, thereby increasing its bandwidth.

Ideally, the preamplifier gain should be high enough that most input signals will actually drive the output into saturation; an ideal comparator would shift its output between low and high whenever there was an infinitesimal difference between its two inputs. In practice, this is not always quite the case. Furthermore, the input signal should generally be sampled and digitized at regularly spaced times. In between the sampling times the comparator should track the input signal, as part of a track mode. In order to ensure this regular sampling, and to further ensure that the output is either a digital 0 or a digital 1, the latch 204 is connected to the output of the preamplifier 202, as referenced above and illustrated in FIG. 2.

Figure 4:
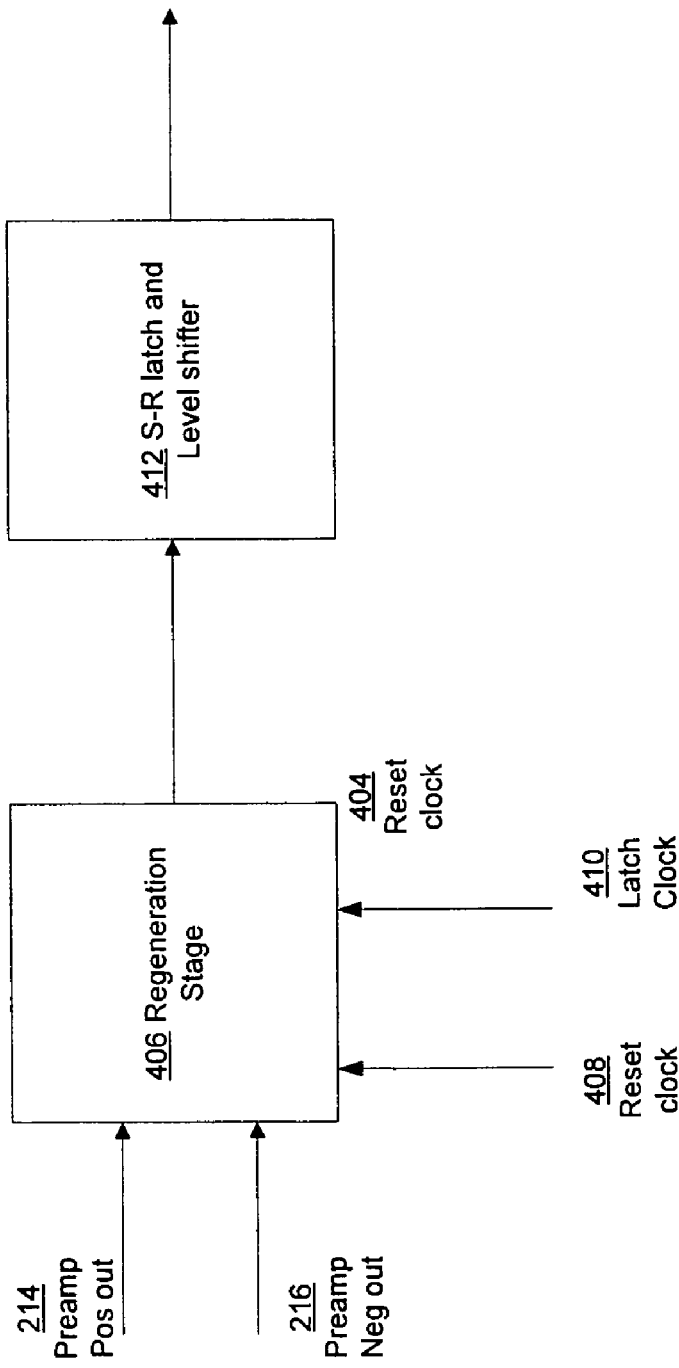
FIG. 4 is a block diagram of a latch stage of a comparator in FIG. 1 and/or FIG. 2.

FIG. 4 shows a block diagram of the latch 204. In the example of FIG. 4, the latch 204 includes two primary components: a regeneration stage 406 and a S-R latch and level shifter stage 412. The inputs to the regeneration stage include the positive, p2 214, and negative, n2 218, outputs of the preamplifier 202.

The regeneration stage 406 performs a thresholding operation on these outputs 214/216 of the preamplifier 202. The regeneration stage 406 is also configured so that it is driven by two clocks. The first clock, 408, resets the regeneration stage output such that when the second clock 410 signals, the regeneration stage can function correctly and immediately amplify the voltage difference of n2 216, p2 214 from the preamplifier 202 to rail-to-rail signals. Once the regeneration is complete, the signal levels are latched through a S-R latch (and level shifter) 412 of the latch 204, such that the latch output changes at the clock edge of the latch clock 410.

The design of the regeneration stage 406 is such that after the latch clock 410 has sampled the input signal, the regeneration stage 406 remains in whatever state it was in until the next reset clock. By having the reset clock 408 precede the latch clock 410 by a small amount, the latch 204 may be provided with sufficient time to regenerate at the new value that is being sampled. If the clocks 408, 410 are not delayed, then the regeneration stage may not have time to regenerate, potentially resulting in increased error in the output. The remainder of the latch 204 is a S-R latch and level shifter 412 that is used to convert the output of the regeneration stage 406 to the standard digital voltages that are in use by the rest of the digital circuitry on the integrated circuit, and are not described here in detail.

A number of implementations have been described. Nevertheless, it will be understood that various modifications may be made. Accordingly, other embodiments are within the scope of the following claims.

What is claimed is:

1. A quantizer comprising:
   a resistive divider chain configured to generate a plurality of reference voltages; and
   a set of stacked comparators coupled with the resistive divider chain, each comparator comprising:
   preamplifier stage including an input stage in which a thin oxide metal-oxide-semiconductor (MOS) input transistor is coupled in a cascode configuration with a thick oxide MOS transistor, wherein the thin oxide MOS input transistor comprises a native MOS transistor configured to receive an input signal of the preamplifier stage at its gate terminal, and
   a latch stage coupled with the preamplifier stage.

2. The quantizer of claim 1 wherein the preamplifier further comprises a resistive load coupled with the cascoded transistors.

3. The quantizer of claim 1 wherein the preamplifier is configured as a differential circuit.

4. The quantizer of claim 1 wherein the preamplifier further comprises a current source configured to bias the input stage, and wherein the current source includes cascoded transistors.

5. The quantizer of claim 1 wherein the resistive divider chain-is configured to operate with a source voltage of less than 1 V.

6. The quantizer of claim 1 wherein an input-referred offset voltage at the preamplifier is less than 10 mV, within three standard deviations.

7. The quantizer of claim 1 wherein the latch stage is configured to perform a thresholding operation on an output signal of the preamplifier stage.

8. The quantizer of claim 1 wherein the latch stage comprises a regeneration stage configured to receive a first clock signal and a second clock signal, the first clock signal being configured to reset an output of the regeneration stage and the second clock signal being configured to sample and hold a current value of the regeneration stage.

9. The quantizer of claim 8 wherein the first clock precedes the second clock.

10. A quantizer for use in a flash ADC integrated on a CMOS integrated circuit wireless transceiver, the quantizer comprising:
    a chain of resistive elements configured to provide respective reference voltages to a set of matched comparators, wherein each comparator comprises:
    a preamplifier comprising a differential input stage, the differential input stage including a pair of complementary transistors, the complementary transistors including:

an input transistor of a native thin oxide type, the input transistor being configured to receive an input signal of the preamplifier stage at its gate; and a cascoded transistor of a thick oxide type, and a latch stage coupled with an output of the preamplifier.

11. The quantizer of claim 10 further comprising a load including a passive element coupled with the cascoded, differential input stage.

12. The quantizer of claim 10 wherein each comparator further comprises a current source configured to bias the input stage, the current source comprising cascoded transistors.

13. The quantizer of claim 10 wherein the latch stage is configured to receive a first clock signal and a second clock signal, wherein the first clock signal resets the latch and the second clock signal sets an output of the latch stage based on a state of the preamplifier.

14. The quantizer of claim 13 wherein the second clock signal is delayed relative to the first clock signal.

15. A preamplifier for use in a comparator, the preamplifier comprising:

an input stage including a first transistor coupled in cascode fashion-with a second transistor;

a resistive load coupled with the first transistor;

a reference input stage including a third transistor coupled in cascode fashion with a fourth transistor; and a current source, wherein the first and third transistors are coupled with each other and are further coupled with the current source.

16. The preamplifier of claim 15 wherein the first and third transistors comprise thin gate oxide transistors, and wherein the second and fourth transistors comprise thick gate oxide transistors.

17. The preamplifier of claim 15 wherein the first and third transistors comprise native devices.

18. The preamplifier of claim 15 wherein the preamplifier is configured as a differential device, the preamplifier further comprising:

a second input stage including a fifth transistor coupled in cascode fashion with a sixth transistor;

a second resistive load coupled with the fifth transistor;

a second reference input stage including a seventh transistor coupled in cascade fashion with an eighth transistor; and a second current source, wherein the fifth and seventh transistors are coupled with each other and are further coupled with the second current source.

* * * * *

UNITED STATES PATENT AND TRADEMARK OFFICE
CERTIFICATE OF CORRECTION

| | |
|---|---|
| PATENT NO. | : 7,420,497 B2 |
| APPLICATION NO. | : 11/477271 |
| DATED | : September 2, 2008 |
| INVENTOR(S) | : Janice Chiu |

It is certified that error appears in the above-identified patent and that said Letters Patent is hereby corrected as shown below:

Column 8, Line 24, before "preamplifier" please insert --a--

Signed and Sealed this

Tenth Day of March, 2009

JOHN DOLL
*Acting Director of the United States Patent and Trademark Office*